United States Patent
Copeland et al.

(10) Patent No.: US 6,596,621 B1
(45) Date of Patent: Jul. 22, 2003

(54) METHOD OF FORMING A LEAD-FREE TIN-SILVER-COPPER BASED SOLDER ALLOY ON AN ELECTRONIC SUBSTRATE

(75) Inventors: Bruce Anthony Copeland, Wappingers Falls, NY (US); Rebecca Yung Gorrell, Lagrangeville, NY (US); Mark Anthony Takacs, Poughkeepsie, NY (US); Kenneth J. Travis, Jr., Newburgh, NY (US); Jun Wang, Poughkeepsie, NY (US); Lovell B. Wiggins, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/151,075

(22) Filed: May 17, 2002

(51) Int. Cl.[7] .................. H01L 21/443; H01L 21/445
(52) U.S. Cl. .................................. 438/614; 438/615
(58) Field of Search .................. 438/612, 613, 438/614, 615; 257/737, 738, 772

(56) References Cited

U.S. PATENT DOCUMENTS

| | | | |
|---|---|---|---|
| 4,756,467 A | 7/1988 | Schatzberg | |
| 5,390,080 A | * 2/1995 | Melton et al. | 361/765 |
| 5,719,070 A | 2/1998 | Cook et al. | |
| 5,937,320 A | 8/1999 | Andricacos et al. | |
| 6,013,572 A | 1/2000 | Hur et al. | |
| 6,224,690 B1 | * 5/2001 | Andricacos et al. | 148/400 |
| 6,310,403 B1 | * 10/2001 | Zhang et al. | 257/786 |
| 6,413,851 B1 | * 7/2002 | Chow et al. | 438/613 |

FOREIGN PATENT DOCUMENTS

JP        1-264233        10/1989

OTHER PUBLICATIONS

Research Disclosure, Aug. 1991, No. 328 entitled "Improved Capture Pad Metallurgy"(32847).

* cited by examiner

Primary Examiner—Carl Whitehead, Jr.
Assistant Examiner—Stephen W. Smoot
(74) Attorney, Agent, or Firm—Ira D. Blecker

(57) ABSTRACT

A method of forming a lead-free solder alloy on an electronic substrate. In the method, a metal stack which includes a thick nickel barrier layer and an outer copper layer is then evaporated or plated with silver and tin. Upon heating to an appropriate temperature, the copper, tin and silver form a lead-free tin, silver, copper solder.

20 Claims, 2 Drawing Sheets

METHOD OF FORMING A LEAD-FREE TIN-SILVER-COPPER BASED SOLDER ALLOY ON AN ELECTRONIC SUBSTRATE

BACKGROUND OF THE INVENTION

The present invention relates to the joining of electronic devices to a substrate through a solder connection and, more particularly, relates to the joining of electronic devices such as chips, capacitors and the like to a suitable ceramic or organic substrate through a lead-free solder connection.

The so-called controlled collapse chip connection (also known as C4) is a means of connecting chips (also known as semiconductor devices), capacitors and the like to an organic or ceramic package (also known as an electronic substrate). The means of connecting chips having C4 connections is actually an array of small solder balls on the surface of the chip, capacitor or the like (hereafter collectively referred to as an electronic device).

In C4 structures, the electronic device wiring is terminated by a plurality of metal films (also referred as a metal stack) that form the ball-limiting metallurgy (BLM). The BLM is sometimes referred to as under bump metallurgy (UBM). The BLM defines the size of the solder bump after reflow, provides a surface that is wettable by the solder and that reacts with the solder to provide good adhesion and acceptable reliability under mechanical and heat stress, and is a barrier between the electronic device and the metals in the interconnection.

A typical BLM is a thin film stack consisting of a Cr or TiW adhesion layer, a phased-in CrCu layer and then Cu. The solder typically used is a Pb/Sn solder with high Pb-content of 95 weight percent or more. Sn is kept to a minimum, usually less than 5 weight percent because Sn reacts readily with the Cu to form usually undesirable intermetallics. The higher the Sn, the more the solder reacts with the Cu. Consequently, there may also be a Ni or Co barrier layer to either protect the Cu layer from being consumed by the solder or protect the layers of the BLM underneath the Cu layer.

Solder alloys containing Pb are now recognized as being harmful to the environment so there is considerable interest in going to Pb-free solders. Two commercially-available lead free solders are Sn—Ag and Sn—Ag—Cu.

Hur et al. U.S. Pat. No. 6,013,572, the disclosure of which is incorporated by reference herein, discloses a method to fabricate a Sn/3.5 weight percent Ag solder bump by plating of a first thick layer of Ag and a second layer of Sn upon a BLM consisting of a first layer of Ti, Cr or TiW and a second layer of Cu or Ni. The BLM layers may be formed by sputtering. After reflow, the SnAg alloy solder bump is formed.

Andricacos et al. U.S. Pat. No. 5,937,320, the disclosure of which is incorporated by reference herein, discloses a method of forming the BLM in which a Ni barrier layer is plated onto the BLM to protect the underlying Cu layer from attack by a PbSn solder. It is noted therein that interconnections with no remaining Cu will not survive the mechanical stresses of thermal cycling.

Cook et al. U.S. Pat. No. 5,719,070, the disclosure of which is incorporated by reference herein, discloses a BLM of Ti/Ni/Cu/Au which is joined with Pb/Sn solder or other suitable solder such as bismuth solders. Both the BLM and solder are formed by evaporation. The purpose of the Ni layer is to reduce corrosion of the underlying refractory metal The thickness of the Ni layer is in the range of 400 to 1000 Angstroms.

Schatzberg U.S. Pat. No. 4,756,467, the disclosure of which is incorporated by reference herein, discloses the sequential plating of Ag then Sn on a Cu wire followed by heating to form a Ag—Sn interface layer between the respective Sn and Ag layers.

Kurihara Published Patent Application 1-264233, the disclosure of which is incorporated by reference herein, discloses a reduced stress Cu/Cr/Ni—Cu/Au BLM onto which solder is placed.

Research Disclosure, Number 328 (August 1991), the disclosure of which is incorporated by reference herein, discloses a Cr/Au (or Ni)/Cu/Au (or Ni)/Cr capture pad.

Notwithstanding the efforts of those above, there remains a need for a BLM that is compatible with a lead-free solder.

Accordingly, it is a purpose of the present invention to have a BLM that is compatible with a lead-free solder.

It is another purpose of the present invention to have a BLM compatible with a lead-free solder that is readily manufacturable.

It is yet another purpose of the present invention to have a BLM compatible with a lead-free solder that is protected from dissolution in the lead-free solder.

These and other purposes of the present invention will become more apparent after referring to the following description of the invention in conjunction with the accompanying Figures.

BRIEF SUMMARY OF THE INVENTION

The purposes of the invention have been achieved by providing a method of forming a lead-free solder alloy on an electronic substrate, the method comprising the steps of:
(a) obtaining an electronic substrate having a pad;
(b) forming a metal stack on the pad comprising:
    (i) depositing an adhesion layer on the pad;
    (ii) depositing a nickel layer on the adhesion layer;
    (iii) evaporating or plating a copper layer on the nickel layer; and
    (iv) evaporating or plating quantities of tin and silver on the copper layer; and
(c) heating the electronic substrate and the metal stack to a predetermined temperature to cause melting of the tin and silver and at least a portion of the copper so as to form a lead-free tin, silver and copper alloy on the electronic substrate.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1A:
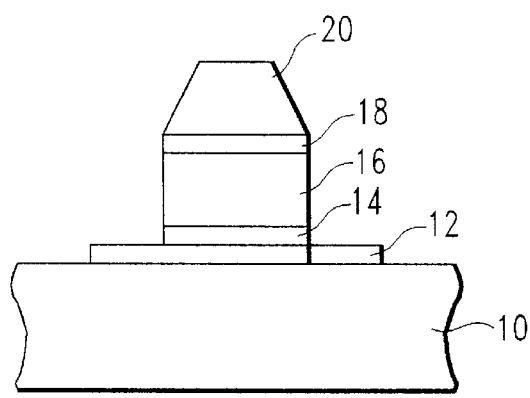
FIGS. 1A and 1B show a first embodiment of the method according to the present invention before and after reflow, respectively.

The present invention is directed to the in-situ formation of a lead-free Sn/Ag/Cu solder alloy on an electronic substrate. While Sn/Ag/Cu solder alloys per se are commercially available, these alloys may be in the form of pastes which leave an undesirable residue on the surface of the electronic substrate. Alternatively, such alloys are available for evaporation but detrimentally high temperatures are required to evaporate such alloys, particularly the copper portion of such alloys which evaporates at a much higher temperature than tin.

Referring now to the Figures in more detail, and particularly referring to FIGS. 1A and 1B, the first embodiment of the method according to the present invention will be described. As first shown in FIG. 1A, a metal stack consisting of a plurality of thin films is formed on electronic substrate 10. The metal stack includes one or more adhesion layers 12, 14 which may be, for example, Cr or TiW, a thick Ni barrier layer 16, a Cu layer 18, and a Sn/Ag layer 20. The adhesion layers 12, 14 and thick Ni barrier layer 16 are conventionally deposited by evaporation or other method. Cu layer 18 is then evaporated or plated. Thereafter, Sn/Ag layer 20 is evaporated or plated onto the Cu layer 18. Sn/Ag layer 20 has a nominal composition, in weight percent, of 3.5% Ag, remainder Sn.

The nominal thickness of adhesion layers 12 and 14 are 2500 Angstroms and 1500 Angstroms, respectively. The thickness of the Ni barrier layer 16 is about 15000 Angstroms to 20000 Angstroms. The thickness of the Ni barrier layer can't be too thick as it is a high stress layer but it can't be too thin or else it wouldn't be an effective barrier layer. The foregoing range of Ni thickness has been found to give good results. The Cu layer 18 should have a nominal thickness of 2000 Angstroms to 4000 Angstroms. The precise thickness of the Cu layer 18 and the composition and thickness of the Sn/Ag layer 20 are determined by the final desired composition of the reflowed solder.

Figure 1B:
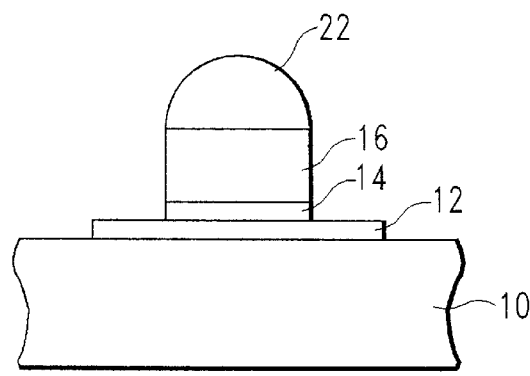

Referring now to FIG. 1B, the electronic substrate 10 and metal stack have been reheated at about 245° C. to reflow the solder. As can be seen, after reflow, the Cu layer 18 has been consumed by Sn/Ag layer 20 to result in reflowed Sn/Ag/Cu solder ball 22. Depending on the relative proportions of Sn, Ag and Cu, the Cu could be consumed after the first reflow. In one example, a Cu layer 18 having a thickness of 3000 Angstroms and a Sn/Ag layer 20 having a composition, in weight percent, of 96.5% Sn and 3.5% Ag (total thickness of the Cu layer 18 and Sn/Ag layer 20 was 0.112 mm) was reflowed at about 245° C. to result in a Sn/Ag/Cu composition, in weight percent, of 3.5% Ag, 0.6% Cu, remainder Sn. The Cu layer 18 was entirely consumed after the first reflow. The preferred final composition of the reflowed Sn/Ag/Cu solder is, in weight percent, 95.9% Sn, 3.5% Ag and 0.6% Cu.

Figure 2A:
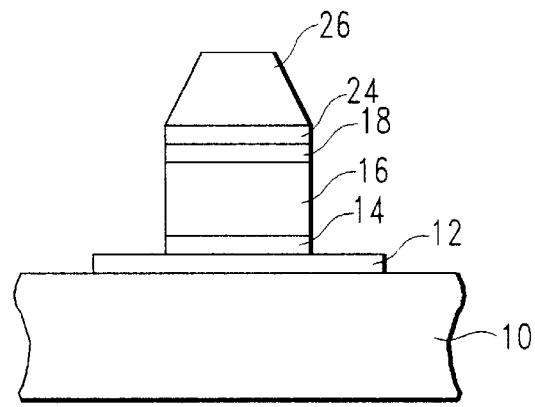
FIGS. 2A and 2B show a second embodiment of the method according to the present invention before and after reflow, respectively.
Figure 2B:
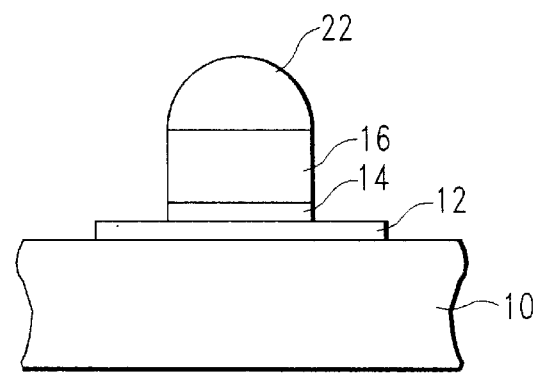

Referring now to a second embodiment of the invention as illustrated in FIGS. 2A and 2B, and particularly referring to FIG. 2A, the electronic substrate 10, adhesion layer or layers 12, 14, Ni barrier layer 16 and Cu layer 18 are as described previously. In this embodiment, the previous Sn/Ag layer is formed as a separate Ag layer 24 and Sn layer 26.

The nominal thickness of Ag layer 24 is 1000 Angstroms and the nominal thickness of Sn layer 26 is 0.110 mm. As before, the precise thickness of Cu layer 18, Ag layer 24 and Sn layer 26 will depend on the final desired composition of the Sn/Ag/Cu alloy.

Referring now to FIG. 2B, the electronic substrate 10 and metal stack have been heated so that the separate Cu layer 18, Ag layer 24 and Sn layer 26 have melted to form reflowed Sn/Ag/Cu solder ball 22. In one example, a Cu layer 18 having a thickness of 3000 Angstroms, a Ag layer 24 having a thickness of 1000 Angstroms and a Sn layer 26 having a thickness of 0.110 mm. was reflowed at about 245° C. to result in a Sn/Ag/Cu composition, in weight percent, of 97.2% Sn, 2% Ag and 0.8% Cu. The Cu layer 18 and Ag layer 24 were entirely consumed after the first reflow.

Figure 3A:
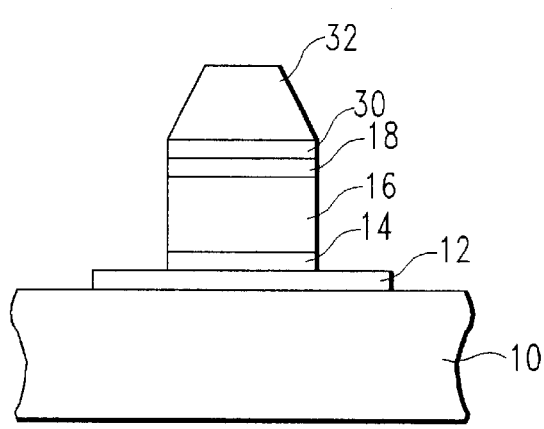
FIGS. 3A and 3B show a third embodiment of the method according to the present invention before and after reflow, respectively.
Figure 3B:
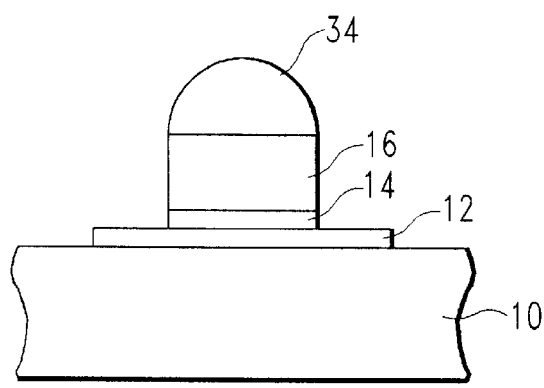

In the embodiment illustrated in FIG. 1A, the adhesion layers 12, 14, Ni barrier layer 16 and Cu layer 18 may be formed in one evaporation phase (when the respective layers are evaporated instead of being plated) while the Sn/Ag layer 20 is evaporated in a second evaporation phase. During the transfer between phases, the Cu layer 18 will be exposed to the atmosphere, and hence oxidized, which would interfere with Sn/Ag layer 20. Accordingly, in a third embodiment of the present invention illustrated in FIG. 3A, the present inventors add an Au layer 30 on top of the Cu layer 18. The Au layer 30 acts as a barrier which is not oxidized by the atmosphere when the transfer occurs. The nominal thickness of the Au layer 30 is 1000 Angstroms. Upon subsequent heating to reflow the Sn/Ag layer 32, the Cu layer 18 and Au layer 30 are consumed by the Sn/Ag layer 32 to form a Sn/Ag/Cu/Au quartenary solder alloy 34 as illustrated in FIG. 3B.

Figure 4A:
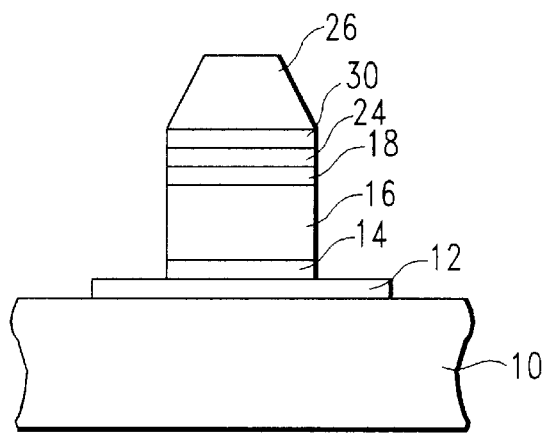
FIGS. 4A and 4B show a fourth embodiment of the method according to the present invention before and after reflow, respectively.
Figure 4B:
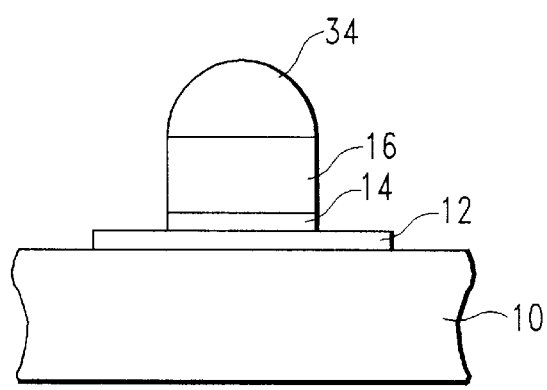

In a fourth embodiment of the present invention as illustrated in FIG. 4A, the metal stack shown therein is identical to the metal stack shown in FIG. 2A except the metal stack shown in FIG. 4A further includes Au layer 30. Au layer 30 is added for the same reason as Au layer 30 in FIG. 3A. After reflow, the fourth embodiment of the present invention (as illustrated in FIG. 4A) appears as shown in FIG. 4B. Again, the Cu layer 18 and Au layer 30 are consumed by the Sn and Ag layers, 26, 24, respectively, to form a Sn/Ag/Cu/Au quartenary solder alloy 34, which has the same composition as the Sn/Ag/Cu/Au quartenary solder alloy 34 in FIG. 3B.

The Au layer 30 of FIGS. 3A and 4A is desirable to protect the Cu layer 18 (FIG. 3A) or Ag layer 24 (FIG. 4A) from oxidizing in one preferred embodiment of the present invention. However, the Au layer 30 is not absolutely necessary as the Cu layer 18 (FIG. 3A) or Ag layer 24 (FIG. 4A) could be sputter cleaned prior to evaporation of the Sn/Ag layer 32 (FIG. 3A) or Sn layer 26 (FIG. 4A). Moreover, if the Sn/Ag layer 32 (FIG. 3A) or Sn layer 26 (FIG. 4A) were plated, the plating bath would also remove any oxides from the layer to be plated, thereby obviating the need for the Au layer.

The electronic-substrate 10 that is appropriate for the present invention can be a semiconductor device such as a chip or wafer or a passive device such as a capacitor, particularly a decoupling capacitor. If the present invention is utilized for semiconductor devices, the Cu, Ag and Sn (or Ag/Sn) layers can be evaporated or plated. If the present invention is a capacitor, particularly a decoupling capacitor, the Cu, Ag and Sn (or Ag/Sn) layers can only be evaporated since the capacitor body is so small (approximately 1.6× 1.85×0.875 mm.) that there is no place to connect the electrodes for plating.

As noted earlier, the present inventors believe that it is undesirable to use a Sn/Ag/Cu paste because of the flux and organometallic residue after reflow. The present inventors further believe that depositing the Cu layer prior to the Sn/Ag layer (or separate Sn and Ag layers) enhances the protection of the Ni barrier layer during solder reflow. The Cu layer protects the Ni barrier layer and once all of the Cu layer is consumed, complex Cu/Sn/Ag intermetallics form at the interface with the Ni barrier layer which helps to protect the Ni barrier layer from degradation. The present inventors have found that even after 13 solder reflows, the Ni barrier remains as a continuous layer. In contrast, a Sn/Ag solder alloy (without Cu) consumes more of the Ni barrier layer and creates a discontinuous Ni layer.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of forming a lead-free solder alloy on an electronic substrate, the method comprising the steps of:
   (a) obtaining an electronic substrate having a pad;
   (b) forming a metal stack on the pad comprising:
      (i) depositing an adhesion layer on the pad;
      (ii) depositing a nickel layer on the adhesion layer;
      (iii) evaporating or plating a copper layer on the nickel layer; and
      (iv) evaporating or plating quantities of tin and silver on the copper layer; and
   (c) heating the electronic substrate and the metal stack to a predetermined temperature to cause melting of the tin and silver and at least a portion of the copper so as to form a lead-free tin, silver and copper alloy on the electronic substrate.

2. The method of claim 1 wherein the step of evaporating or plating quantities of tin and silver is evaporating and comprises evaporating a tin/silver alloy.

3. The method of claim 2 wherein the tin/silver alloy is, in weight percent, 3.5% Ag, remainder Sn.

4. The method of claim 1 further comprising the step between step (b)(iii) and step (b)(iv) of evaporating or plating a gold layer onto the copper layer and wherein in the step of heating, a lead-free tin, silver, copper and gold alloy is formed on the electronic substrate.

5. The method of claim 1 wherein the step of evaporating or plating quantities of tin and silver comprises evaporating or plating a layer of silver followed by evaporating or plating a layer of tin.

6. The method of claim 5 further comprising the step of evaporating or plating a gold layer onto the silver layer prior to the step of evaporating or plating a layer of tin and wherein in the step of heating, a lead-free tin, silver, copper and gold alloy is formed on the electronic substrate.

7. The method of claim 1 wherein the nickel is deposited to a thickness of 15000 to 20000 Angstroms and the copper is evaporated or plated to a thickness of 2000 to 4000 Angstroms.

8. The method of claim 1 wherein the composition of the tin, silver and copper alloy is, in weight percent, 3.5% silver, 0.5–1.0% copper, remainder tin.

9. The method of claim 1 further comprising the step of repeating the step of heating a predetermined number of times wherein the amount of copper increases in the lead-free tin, silver and copper alloy with each heating until the copper layer is entirely consumed.

10. The method of claim 1 wherein the electronic substrate is a semiconductor device.

11. The method of claim 1 wherein the electronic substrate is a capacitor.

12. A method of forming a lead-free solder alloy on a capacitor, the method comprising the steps of:
    (a) obtaining a capacitor having a pad;
    (b) forming a metal stack on the pad comprising:
       (i) depositing an adhesion layer on the pad;
       (ii) depositing a nickel layer on the adhesion layer;
       (iii) evaporating a copper layer on the nickel layer; and
       (iv) evaporating quantities of tin and silver on the copper layer; and
    (c) heating the capacitor and the metal stack to a predetermined temperature to cause melting of the tin and silver and at least a portion of the copper so as to form a lead-free tin, silver and copper alloy on the capacitor.

13. The method of claim 12 wherein the step of evaporating quantities of tin and silver comprises evaporating a tin/silver alloy.

14. The method of claim 13 wherein the tin/silver alloy is, in weight percent, 3.5% Ag, remainder Sn.

15. The method of claim 12 further comprising the step between step (b)(iii) and step (b)(iv) of evaporating or plating a gold layer onto the copper layer and wherein in the step of heating, a lead-free tin, silver, copper and gold alloy is formed on the electronic substrate.

16. The method of claim 12 wherein the step of evaporating quantities of tin and silver comprises evaporating a layer of silver followed by evaporating a layer of tin.

17. The method of claim 16 further comprising the step of evaporating a gold layer onto the silver layer prior to the step of evaporating a layer of tin and wherein in the step of heating, a lead-free tin, silver, copper and gold alloy is formed on the capacitor.

18. The method of claim 12 wherein the nickel is deposited to a thickness of 15000 to 20000 Angstroms and the copper is evaporated to a thickness of 2000 to 4000 Angstroms.

19. The method of claim 12 wherein the composition of the tin, silver and copper alloy is, in weight percent, 3.5% silver, 0.5–1.0% copper, remainder tin.

20. The method of claim 12 further comprising the step of repeating the step of heating a predetermined number of times wherein the amount of copper increases in the lead-free tin, silver and copper alloy with each heating until the copper layer is entirely consumed.

* * * * *